(12) United States Patent
Isozaki et al.

(10) Patent No.: US 8,692,194 B2
(45) Date of Patent: *Apr. 8, 2014

(54) ELECTRON MICROSCOPE DEVICE

(75) Inventors: Hisashi Isozaki, Tokyo-to (JP);
Hirotaka Tanaka, Tokyo-to (JP)

(73) Assignee: Horiba Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/165,046

(22) Filed: Jun. 21, 2011

(65) Prior Publication Data

US 2011/0315877 A1 Dec. 29, 2011

(30) Foreign Application Priority Data

Jun. 24, 2010 (JP) ................... 2010-143543

(51) Int. Cl.
*H01J 37/28* (2006.01)
*H01J 37/22* (2006.01)

(52) U.S. Cl.
CPC ............. *H01J 37/228* (2013.01); *H01J 37/28* (2013.01); *H01J 37/226* (2013.01)
USPC ...................................... 250/310

(58) Field of Classification Search
CPC ........ H01J 37/28; H01J 37/228; H01J 37/226
USPC ............................... 250/310–311
See application file for complete search history.

(56) References Cited

U.S. PATENT DOCUMENTS 5,333,495 A 8/1994 Yamaguchi et al.
5,399,869 A * 3/1995 Usuda .................. 250/486.1

(Continued)

FOREIGN PATENT DOCUMENTS

JP 1-122555 A 5/1989
JP 1-149354 A 6/1989

(Continued)

OTHER PUBLICATIONS

Final Rejection mailed Feb. 21, 2012 in co-pending U.S. Appl. No. 12/653,366.

(Continued)

*Primary Examiner* — David A Vanore
*Assistant Examiner* — Wyatt Stoffa
(74) *Attorney, Agent, or Firm* — Nields, Lemack & Frame, LLC

(57) ABSTRACT

The present invention provides an electron microscope device, comprising a scanning electron microscope 2 and an optical microscope 3, wherein the scanning electron microscope has scanning means 10 for scanning an electron beam and an electron detector 12 for detecting electron 11 issued from a specimen 8 scanned over by the electron beam, and the scanning electron microscope acquires a scanning electron image based on a detection result from the electron detector, the optical microscope has a light emitting source 13 for illuminating an illumination light, and the optical microscope illuminates the illumination light to the specimen, and acquires an optical image by receiving a reflection light from the specimen, and wherein the electron detector has a fluorescent substance layer for electron-light conversion, a wavelength filter for restricting so that all or almost all of wavelength ranges of the fluorescent light from the fluorescent substance layer passes through, and a wavelength detecting element for receiving the fluorescent light passing through the wavelength filter and performing optical-electric conversion, wherein the light amount of the illumination light in the wavelength range passing through the wavelength filter does not exceed a limit of deterioration of the scanning electron image.

8 Claims, 10 Drawing Sheets

(56) References Cited

U.S. PATENT DOCUMENTS

| | | | |
|---|---|---|---|
| 6,031,230 A * | 2/2000 | Toumatsu | 250/310 |
| 6,204,918 B1 * | 3/2001 | Isozaki et al. | 356/239.8 |
| 6,373,070 B1 * | 4/2002 | Rasmussen | 250/492.21 |
| 6,407,373 B1 * | 6/2002 | Dotan | 250/201.3 |
| 7,045,791 B2 * | 5/2006 | Benas-Sayag et al. | 250/396 R |
| 7,157,703 B2 | 1/2007 | Nakasuji et al. | |
| 7,317,515 B2 * | 1/2008 | Buijsse et al. | 356/72 |
| 8,097,849 B2 | 1/2012 | Ohtomo et al. | |
| 2004/0218172 A1 * | 11/2004 | DeVerse et al. | 356/300 |
| 2009/0002695 A1 * | 1/2009 | Saito et al. | 356/237.4 |
| 2010/0051802 A1 * | 3/2010 | Marchman et al. | 250/306 |
| 2010/0091362 A1 * | 4/2010 | Isozaki et al. | 359/369 |
| 2010/0163728 A1 * | 7/2010 | Ohtomo et al. | 250/310 |
| 2010/0163729 A1 * | 7/2010 | Isozaki | 250/310 |
| 2011/0180715 A1 * | 7/2011 | Ronda et al. | 250/362 |
| 2012/0161000 A1 * | 6/2012 | Tateno | 250/310 |

FOREIGN PATENT DOCUMENTS

| | | | |
|---|---|---|---|
| JP | 4-2800053 A | | 10/1992 |
| JP | 04280053 A | * | 10/1992 |
| JP | 11-108864 A | | 4/1999 |
| JP | 2008-305905 A | | 12/2008 |
| JP | 2010-157392 A | | 7/2010 |
| JP | 2010-157393 A | | 7/2010 |

OTHER PUBLICATIONS

Notice of Allowance mailed Oct. 3, 2011 in co-pending U.S. Appl. No. 12/653,324.

Office Action mailed Sep. 21, 2011 in co-pending U.S. Appl. No. 12/653,366.

Office Action mailed May 20, 2013 in co-pending U.S. Appl. No. 12/653,366.

Final Rejection mailed Oct. 25, 2013 in co-pending U.S. Appl. No. 12/653,366.

* cited by examiner

ELECTRON MICROSCOPE DEVICE

BACKGROUND OF THE INVENTION

The present invention relates to an electron microscope device, by which it is possible to observe and examine a scanning electron image and an optical image of a specimen. In particular, the invention relates to an electron microscope device, by which an optical image can be observed at the same time during electron scanning operation.

A scanning electron microscope (SEM) is designed in such manner that an electron beam is projected for scanning over a specimen, and the electron issued from the specimen by the projection of the electron beam is detected and a scanning electron image is acquired as to properties of a surface of the specimen.

On the other hand, a field angle of the electron beam is very small, and it is very difficult to project the electron beam to a specific position unless a projecting position is identified and recognized in advance.

For this reason, an electron microscope device is provided with an optical microscope, which has lower magnification as compared with the electron microscope. First, an illumination light (white light) is projected to the specimen, and the specimen is observed by the optical microscope, and a projected position is specified. Then, a change over from the optical microscope to the electron microscope is performed, the electron beam is projected to scan over the projected position of the specimen and the specimen is observed.

In case it is wanted to acquire a scanning electron image, electrons emitted from the specimen are launched into a fluorescent substance. A light emitted from the fluorescent substance is converted to an electric signal by a photoelectric conversion element, and a scanning electron image is acquired based on this electric signal. In case an optical image is acquired by using the optical microscope, a light reflected from the specimen is received by a photoelectric element for the optical microscope, and is converted to the electric signal, and the optical image is acquired based on this electric signal.

However, in case where electrons obtained by scanning of the electron beam are compared with a light reflected from the specimen, a energy level of the reflected light is extremely higher than an energy level of electrons. When a reflected light from the specimen enters the photoelectric element, which detects the electron beam, the photoelectric element is saturated or S/N ratio is extremely low, and the electron beam cannot be detected.

Therefore, it has been practiced in the past that the microscopes are changed completely between in an observation by the optical microscope and in an observation by the electron microscope so that the electron microscope is not used for observation during the observation by the optical microscope, and that the optical microscope is not used for observation during the observation by the electron microscope.

For instance, the optical microscope and the electron microscope are separated from each other, and an optical axis of the optical microscope and an optical axis of the electron microscope are set in a known specific relation. When a table on which the specimen placed is moved between the optical microscope and the electron microscope, a position to observe an optical image is associated with a position to observe a scanning electron image.

In this respect, in a conventional type electron microscope, there has been a problem that the structure is very complicated and the scanning electron image and the optical image cannot be observed at the same time.

An electron microscope, by which the scanning electron image and the optical image can be observed and examined at the same time, is disclosed in JP-A-4-280053.

In the electron microscope described in JP-A-4-280053, an optical system of the electron microscope and an optical system of the optical microscope have the same optical axis. An illumination light and an electron beam are projected at the same time. In the signals from the electron detector, signals of the illumination light are removed as DC components, and signals containing only electrons are extracted.

However, as described above, the DC components of the illumination light are extremely in higher amount compared with signal components, and it is very difficult to extract signals containing only electrons.

SUMMARY OF THE INVENTION

It is an object of the present invention to provide an electron microscope device, by which it is possible to observe a scanning electron image and an optical image at the same time, and also, to provide the electron microscope device with simpler construction.

To attain the above object, the present invention provides an electron microscope device, comprising a scanning electron microscope and an optical microscope, wherein the scanning electron microscope has scanning means for scanning an electron beam and an electron detector for detecting electron issued from a specimen scanned over by the electron beam, and the scanning electron microscope acquires a scanning electron image based on a detection result from the electron detector, and the optical microscope has a light emitting source for illuminating an illumination light, and the optical microscope illuminates the illumination light to the specimen, and acquires an optical image by receiving a reflection light from the specimen, and wherein the electron detector has a fluorescent substance layer for electron-light conversion, a wavelength filter for restricting so that all or almost all of wavelength ranges of the fluorescent light from the fluorescent substance layer passes through, and a wavelength detecting element for receiving the fluorescent light passing through the wavelength filter and performing optical-electric conversion, wherein the light amount of the illumination light in the wavelength range passing through the wavelength filter does not exceed a limit of deterioration of the scanning electron image.

Also, the present invention provides the electron microscope device as described above, wherein the light emitting source is an LED, and the LED has a light emission property that light intensity of spectrum included in transmission wavelength range of the wavelength filter is lower than light intensity of spectrum included in non-transmission wavelength range. Further, the present invention provides the electron microscope device as described above, wherein the light emitting source is an LED, and the LED has a light mission property that light amount of the transmission wavelength range of the wavelength filter is higher than light amount of the non-transmission wavelength range. Also, the present invention provides the electron microscope device as described above, wherein an illumination light optical system of the optical microscope has a wavelength selective filter for illumination, the light emitting source is an LED, and the wavelength selective filter for illumination restricts a transmissivity of the wavelength corresponding to the transmission wavelength range of the wavelength filter and allows the wavelength corresponding to non-transmission wavelength range of the wavelength filter to pass.

Further, the present invention provides the electron microscope device as described above, comprising a control unit for controlling operation of the scanning electron microscope and the optical microscope, wherein the control unit amplifies and adjusts a color tone with respect to the wavelength band passing through the wavelength selective filter for illumination among the wavelength ranges of optical images acquired by the optical microscope.

Further, the present invention provides the electron microscope device as described above, further comprising a foreign object detecting device for detecting a foreign object by projecting an examination light to surface of the specimen and by detecting a scattered light from the foreign object, wherein the examination light is designed to have a wavelength deviated from the transmission wavelength range of the wavelength filter.

Also, the present invention provides the electron microscope device as described above, further comprising an interferometer for projecting an interference light to surface of the specimen and for detecting a position in height direction of the specimen by using reflection of the interference light from the surface of the specimen, wherein the interference light has a wavelength deviated from the transmission wavelength range of the wavelength filter.

Further, the present invention provides the electron microscope device as described above, further comprising a foreign object detecting device for detecting a foreign object by projecting an examination light to surface of the specimen and by detecting a scattered light from the foreign object, and an interferometer for projecting an interference light to the surface of the specimen and for detecting a position in height direction of the specimen by using reflection of the interference light from the surface of the specimen, wherein the examination light and the interference light have wavelengths deviated from the transmission wavelength range of the wavelength filter, and the examination light and the interference light have wavelength ranges different from each other.

The present invention provides an electron microscope device, comprising a scanning electron microscope and an optical microscope, wherein the scanning electron microscope has scanning means for scanning an electron beam and an electron detector for detecting electron issued from a specimen scanned over by the electron beam, and the scanning electron microscope acquires a scanning electron image based on a detection result from the electron detector, and the optical microscope has a light emitting source for illuminating an illumination light, and the optical microscope illuminates the illumination light to the specimen, and acquires an optical image by receiving a reflection light from the specimen, and wherein the electron detector has a fluorescent substance layer for electron-light conversion, wavelength filter for restricting so that all or almost all of wavelength ranges of the fluorescent light from the fluorescent substance layer passes through, and a wavelength detecting element for receiving the fluorescent light passing through the wavelength filter and performing optical-electric conversion, wherein the light amount of the illumination light in the wavelength range passing through the wavelength filter does not exceed a limit of deterioration of the scanning electron image. As a result, without changing the arrangement of the conventional invention, it is possible to observe the scanning electron images and the optical images.

Further, the present invention provides the electron microscope device as described above, wherein the light emitting source is an LED, and the LED has a light emission property that light intensity of spectrum included in transmission wavelength range of the wavelength filter is lower than light intensity of spectrum included in non-transmission wavelength range. As a result, it is possible to observe clearer and more distinct optical image by suppressing the deterioration of the scanning electron images.

Also, the present invention provides the electron microscope device as described above, wherein the light emitting source is an LED, and the LED has a light emission property that light amount of the transmission wavelength range of the wavelength filter is higher than light amount of the non-transmission wavelength range. As a result, it is possible to observe clearer and more distinct optical image by suppressing the deterioration of the scanning electron images.

Further, the present invention provides the electron microscope device as described above, wherein an illumination light optical system of the optical microscope has a wavelength selective filter for illumination, the light emitting source is an LED, and the wavelength selective filter for illumination restricts a transmissivity of the wavelength corresponding to the transmission wavelength range of the wavelength filter and allows the wavelength corresponding to non-transmission wavelength range of the wavelength filter to pass. As a result, it is possible to observe clearer and more distinct optical image by suppressing the deterioration of the scanning electron images.

Also, the present invention provides the electron microscope device as described above, comprising a control unit for controlling operation of the scanning electron microscope and the optical microscope, wherein the control unit amplifies and adjusts a color tone with respect to the wavelength band passing through the wavelength selective filter for illumination among the wavelength ranges of optical images acquired by the optical microscope. As a result, by suppressing deterioration of the scanning electron microscope, it is possible to observe an optical image which is clearer and more distinct and is closer to natural color.

Further, the present invention provides the electron microscope device as described above, further comprising a foreign object detecting device for detecting a foreign object by projecting an examination light to surface of the specimen and by detecting a scattered light from the foreign object, wherein the examination light is designed to have a wavelength deviated from the transmission wavelength range of the wavelength filter. As a result, the examination light gives no influence on observation and examination of the scanning electron images, and it is possible to observe the scanning electron images and to detect foreign objects, and to observe the foreign objects at the same time. There is no need to mechanically separate the procedure for acquisition of the scanning electron images by the scanning electron microscope from the procedure for detecting the foreign object by the foreign object detecting device. Therefore, the structure of the electron microscope device can be simple.

Also, the present invention provides the electron microscope device as described above, further comprising an interferometer for projecting an interference light to surface of the specimen and for detecting a position in height direction of the specimen by using reflection of the interference light from the surface of the specimen, wherein the interference light has a wavelength deviated from the transmission wavelength range of the wavelength filter. As a result, the interference light gives no influence on the observation and the examination of the scanning electron images, and it is possible to observe the scanning electron images and to measure the height of the specimen at the same time. There is no need to mechanically separate the procedure for acquisition of the scanning electron images by the scanning electron microscope from the procedure for measuring the height of the specimen by the interferometer. Therefore, the structure of the electron microscope device can be simple.

Further, the present invention provides the electron microscope device as described above, further comprising a foreign object detecting device for detecting a foreign object by projecting an examination light to surface of the specimen and by detecting a scattered light from the foreign object, and an interferometer for projecting an interference light to the surface of the specimen and for detecting a position in height direction of the specimen by using reflection of the interference light from the surface of the specimen, wherein the examination light and the interference light have wavelengths deviated from the transmission wavelength range of the wavelength filter, and the examination light and the interference light have wavelength ranges different from each other. As a result, it is possible to observe the scanning electron images, to observe the optical images, to detect foreign objects, to observe foreign objects, and to measure the height of the specimen at the same time. Further, there is no need to mechanically separate the procedure for acquisition of the Scanning electron images by the scanning electron microscope, for acquisition of the optical images by optical microscope, for detection of the foreign object by the foreign object detecting device, and for measurement of the height of the specimen by using the interferometer. Therefore, the structure of the electron microscope device can be simple.

BRIEF DESCRIPTION OF THE DRAWINGS

FIG. 7 (A) shows a case where an illumination intensity of the LED 13a is 1, FIG. 7 (B) shows a case where the illumination intensity is 10, FIG. 7 (C) shows a case where the illumination intensity is 15, FIG. 17 (D) shows a case where the illumination intensity is 20, FIG. 17 (E) a case where the illumination intensity is 30, and FIG. 7 (F) shows a case where the illumination intensity is 40.

FIG. 8 (A) shows a case where the illumination intensity of the LED 13a is 1, FIG. 8 (B) shows a case where the illumination intensity is 10, FIG. 8 (C) shows a case where the illumination intensity is 15, FIG. 8 (D) shows a case where the illumination intensity is 20, FIG. 8 (E) shows a case where the illumination intensity is 30, and FIG. 8 (F) shows a case where the illumination intensity is 40.

FIG. 9 (A) shows a case where the illumination intensity of the LED 13b is 1, FIG. 9 (B) shows a case where the illumination intensity is 10, FIG. 9 (C) shower a case where the illumination intensity is 15, FIG. 9 (D) shows a case where the illumination intensity is 20, FIG. 9 (E) shows a case where the illumination intensity is 30, and FIG. 9 (F) shows a case where the illumination intensity is 40.

FIG. 10 (A) shows a case where the illumination intensity of the LED 13b is 1, FIG. 10 (B) shows a case where the illumination intensity is 10, FIG. 10 (C) shows a case where the illumination intensity is 15, FIG. 10 (D) shows a case where the illumination intensity is 20, FIG. 10 (E) shows a case where the illumination intensity is 30, FIG. 10 (F) shows a case where the illumination intensity is 40.

DETAILED DESCRIPTION OF THE PREFERRED EMBODIMENTS

Figure 1:
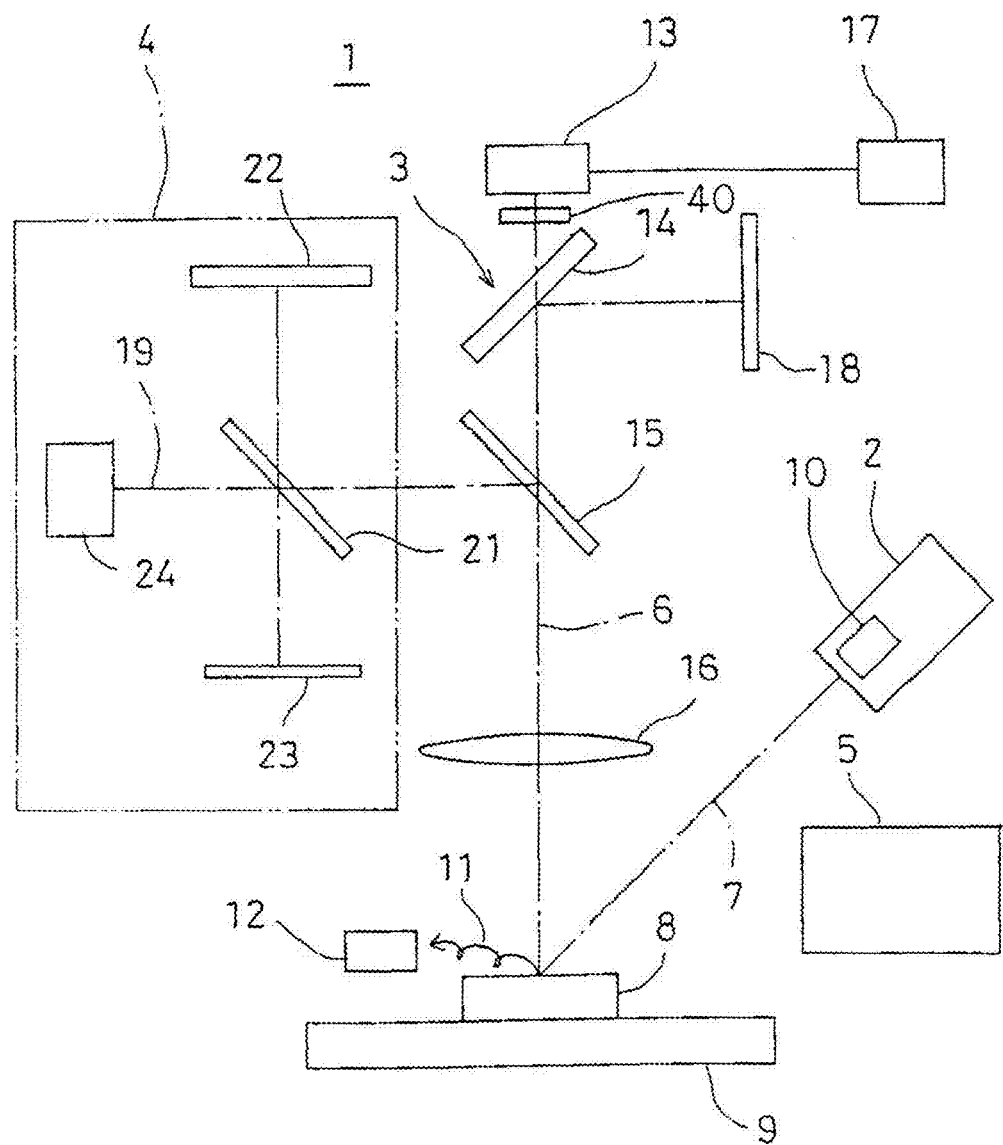
FIG. 1 is a schematical drawing to show an approximate arrangement of an electron microscope device, to which the present invention is applied.

Description will be given below on embodiments of the present invention by referring to the attached drawings.

First, referring to FIG. 1 and FIG. 2, description will be given on general features of an electron microscope device 1 according to the present invention.

The electron microscope device 1 comprises a scanning electron microscope 2, an optical microscope 3, an interferometer 4, and a control unit 5 for controlling operation of the scanning electron microscope 2, the optical microscope 3, and the interferometer 4. An object 8 to be measured (specimen) is placed at a point where an optical axis 6 of the optical microscope 3 crosses an optical axis 7 of the scanning electron microscope 2, and the object 8 to be measured is placed on a specimen stage 9, which is movable along two directions of X-Y to perpendicularly cross the optical axis 6.

The optical axis 7 of the scanning electron microscope is tilted at a predetermined angle (e.g. 60°) to the optical axis 6 of the optical microscope 3, and a point where the optical axis 6 and the optical axis 7 cross each other is an observation point of the object 8 to be measured. An electron beam is projected to the object 8 to be measured along the optical axis 7, and the electron beam is projected for scanning over a predetermined range by an electron beam scanning means 10. By projecting the electron beam to the object 8 to be measured for scanning; an electron 11 emitted from the object 8 to be measured is detected by an electron detector 12. The specimen stage 9 is moved in two directions of X-Y in synchronization with the projection of the electron beam, and the electron beam scans over a predetermined range of the object 8 to be measured.

The result of detection by the electron detector 12 is sent to the control unit 5. Based on the result of detection, a scanning electron image is formed on the control unit 5.

Along the optical axis 6, there are arranged an LED 13 as a light emitting source for emitting an illumination light, a first half-mirror 14, a second half-mirror 15, and an objective lens 16. Further, a wavelength filter 40 (to be described later) is disposed between the LED 13 and the first half-mirror 14. The illumination light emitted from the LED 13 is a white light or a light with a color closer to a white light. That is, the illumination light is a light, which includes a wavelength range to cover approximately total visible light wavelength range. The LED 13, the first half-mirror 14, the wavelength filter 40, the objective lens 16, etc. make up together an illumination optical system of the optical microscope 3.

The emission of the light of the LED 13 is controlled by a light emission drive unit 17. An illumination light emitted from the LED 13 passes through the first half-mirror 14, the second half-mirror 15 and the objective lens 16, and the illumination light is then projected toward the object 6 to be measured. After being reflected by the object 8 to be measured, the illumination light passes through the second half-mirror 15, is reflected by the first half-mirror 14 and is received by a CCD 18 for observation.

The interferometer 4 has an optical axis 19. The optical axis 19 is deflected by the second half-mirror 15 and reaches the object 8 to be measured. Along the optical axis 19, third half-mirror 21 is disposed. There are arranged a CCD 22 for measurement on one side and a reference mirror 23 on the other side with the third half-mirror 21 between them.

From a light source 24 for measurement, a single wavelength light for interference is projected on the optical axis 19. A part of the single wavelength light passes through the third half-mirror 21, is reflected by the second half-mirror 15 and is projected toward the object 8 to be measured via the objective lens 16. After being reflected by the object 8 to be measured, the single wavelength light passes through the second half-mirror 15 and the third half-mirror 21 and is received by the CCD 22 for measurement. The remaining part of the single wavelength light, which is reflected by the third half-mirror 21, is reflected by the reference mirror 23 and passes through the third half-mirror 21 and then, is received by the CCD 22 for measurement. The CCD 22 for measurement receives and detects the reflected light from the object 8 to be measured and the reflected light from the reference mirror 23. Based on an interference of these two reflected lights, a position in height direction of the object 8 to be measured is determined.

Then, a three-dimensional position information of the observation point is acquired from X-Y position of the observation point of the object 8 to be measured and a position in height direction as obtained by the interferometer 4.

A foreign object detecting device 25 is provided for detecting a foreign object on the surface of the object 8 to be measured.

The foreign object detecting device 25 has a light source 26 for foreign object detection which projects an examination light for detecting the foreign object, and a scattered light detector 27 which detects a scattered light reflected by the foreign object. An projection optical axis 28 of the light source 26 for foreign object detection enters the surface of the object 8 to be measured from a direction which is different from the optical axis 7 of the scanning electron microscope 2. An optical axis 29 of the scattered light detector 27 is extended in a direction perpendicular to paper surface of FIG. 2 so that the scattered light can be easily received. Specifically, a plane, which includes the projection light optical axis 28 and the optical axis 6, perpendicularly crosses a plane, which includes the optical axis 29 and the optical axis 6. To facilitate explanation, is shown in FIG. 2 that the projection light optical axis 28 and the optical axis 29 are on the same plane.

The examination light is projected to the surface of the object 8 to be measured. If there is a foreign object on the surface of the object 8 to be measured, the examination light is scattered by the foreign object, and the scattered light is detected by the scattered light detector 27. The size of a detectable foreign object differs according to the wavelength of the examination light used. When a light in red color is used, it is possible to detect a foreign object of sub-micron size which is difficult to be observed by the optical microscope 3. Further, the field angle of the examination light is larger than the field angle of the electron beam, and it is much easier to specify a projecting position of the examination light and to search the examination point (which is to be determined) compared with the case: where the electron beam is used.

Figure 3:
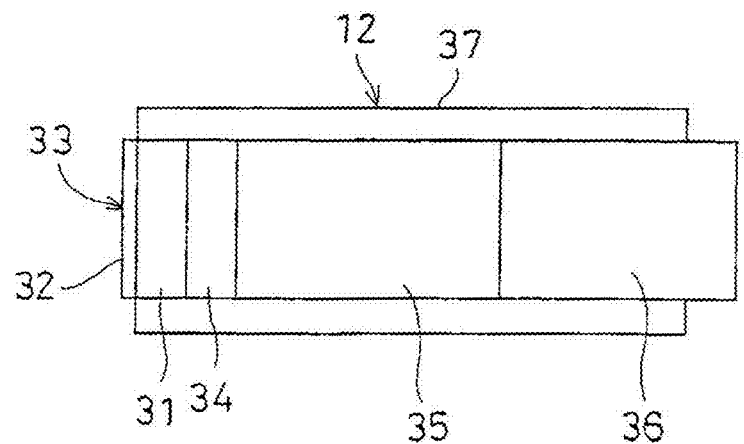
FIG. 3 is a schematical drawing to show an example of an electron detector used in the electron microscope device.

Next, referring to FIG. 3, description will be given on the electron detector 12.

A fluorescent substance layer 32 is formed on a transparent plate 31 such as a glass plate, and an electron-optical conversion member (scintillator) 33 is configured. On the electron-optical conversion member 33, a wavelength filter 34, a light guide 35, and a wavelength detecting element 36 are arranged consecutively. Further, these components are covered by a light-shielding cover 37 and are integrated to make up together the electron detector 12.

When an electron 11 enters the fluorescent substance layer 32, the fluorescent substance layer 32 emits a light (a fluorescent light) with a wavelength in a predetermined range. The fluorescent light passes through the wavelength filter 34 and reaches the wavelength detecting element 36 via the light guide 35. The wavelength detecting element 36 converts the fluorescent light to an electric signal. Accordingly, the electron detector 12 performs the conversion "electron-light-electricity". When the electron 11 enters, an electric signal is issued.

Now, referring to FIG. 4, description will be given further on the electron detector 12.

Figure 4A:
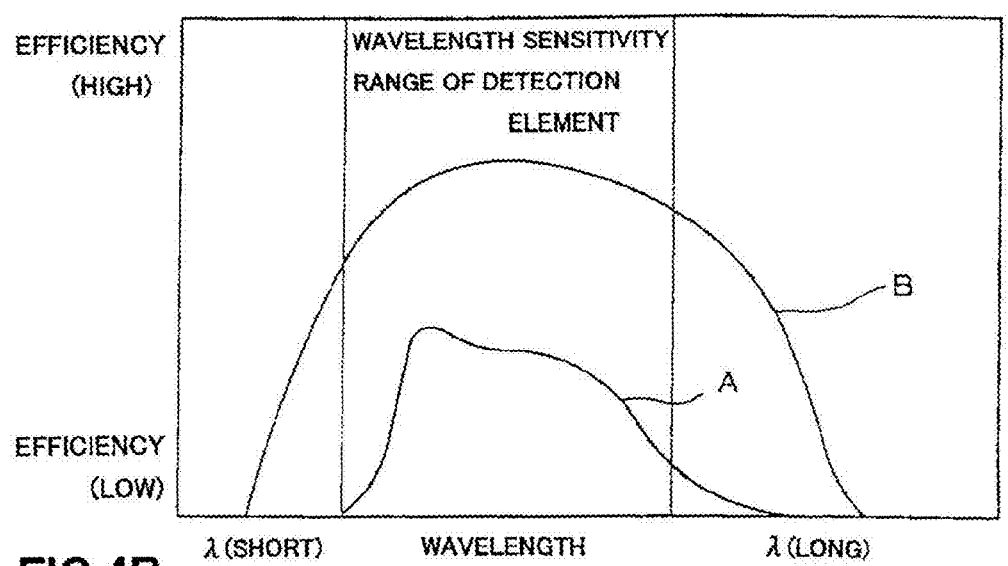
FIG. 4 (A) is a diagram to show a relation between a sensitivity range of a wavelength detecting element and a wavelength range of a fluorescent light emitted from a fluorescent substance layer, and FIG. 4 (B) is a diagram to show a transmission wavelength range of a wavelength filter incorporated in the electron detector.
Figure 4B:
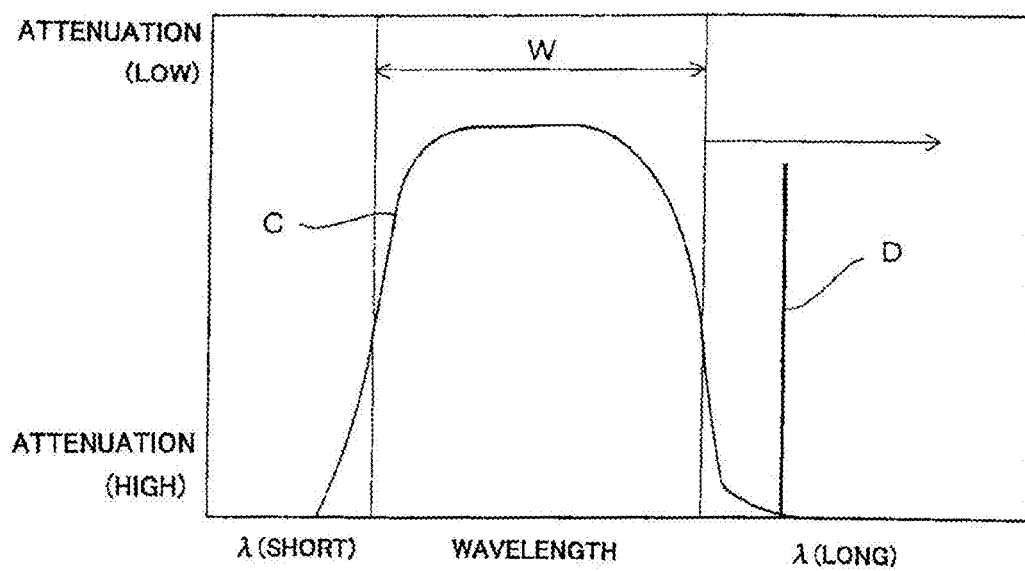

In FIG. 4 (A), a curve A shows a wavelength range of the light to be emitted from the fluorescent substance layer 32, and a curve B indicates a wavelength range of the light detected by the wavelength detecting element 36. As shown in the diagram, the wavelength range of the curve B is wider than the wavelength range of the curve A. Even when the wavelength range to reach the wavelength detecting element 36 is limited to the curve A, i.e. even when the wavelength range to reach the wavelength detecting element 36 is limited to the wavelength range of the fluorescent light emitted from the fluorescent substance layer 32, there occurs no trouble with respect to the sensitivity.

In FIG. 4 (B), a curve C represents wavelength transmission property of the wavelength filter 34. The wavelength filter 34 has a transmission wavelength range W. The transmission wavelength range W includes almost all of the wavelength ranges of the fluorescent lights, and transmission of wavelength is almost limited to the wavelength band of the fluorescent light. For instance, the wavelength filter 34 allows a wavelength range of 300 nm to 600 nm to pass through. In case where transmission range of the wavelength of the fluorescent light is limited by the wavelength filter 34, it is so designed that a transmitting light amount of the fluorescent light is in the range of 90% to 95% or more.

Consequently, if it is so arranged that the wavelength of the single wavelength light for interference which is emitted from the light source 24 for measurement, and the wavelength of the examination light which is emitted from the light source 26 for foreign object detection are deviated from the transmission wavelength range W, it is possible simultaneously to project the electron beam for scanning, to observe the scanning electron image and to measure a height of the object 8 to be measured by the interferometer 4. In addition, it is possible simultaneously to observe the scanning electron image and to detect the foreign object by projection of the examination light from the light source 26 for foreign object detection. In this case, it is preferable that transmissivity is 0.001% or lower when the light from the light source 24 for measurement or the light from the light source 26 for foreign object detection pass through the wavelength filter 34.

For instance, if it is assumed that the wavelength of the examination light emitted from the light source 26 for foreign object detection is represented by a wavelength D in FIG. 4 (B), the examination light is intercepted by the wavelength filter 34, and the light does not reach the wavelength detecting element 36. This means that it is possible to observe the scanning electron image while detecting or observing a foreign object on the surface of the object 8 to be measured by the foreign object detecting device 25.

In case the interferometer 4 is used, there is no need to observe an image, which is obtained by the CCD 22 for measurement, by visual inspection. Therefore, the selectable wavelength range is wider, and a wavelength of the transmission wavelength range W or a wavelength other than the wavelength D can be easily selected.

Figure 5:
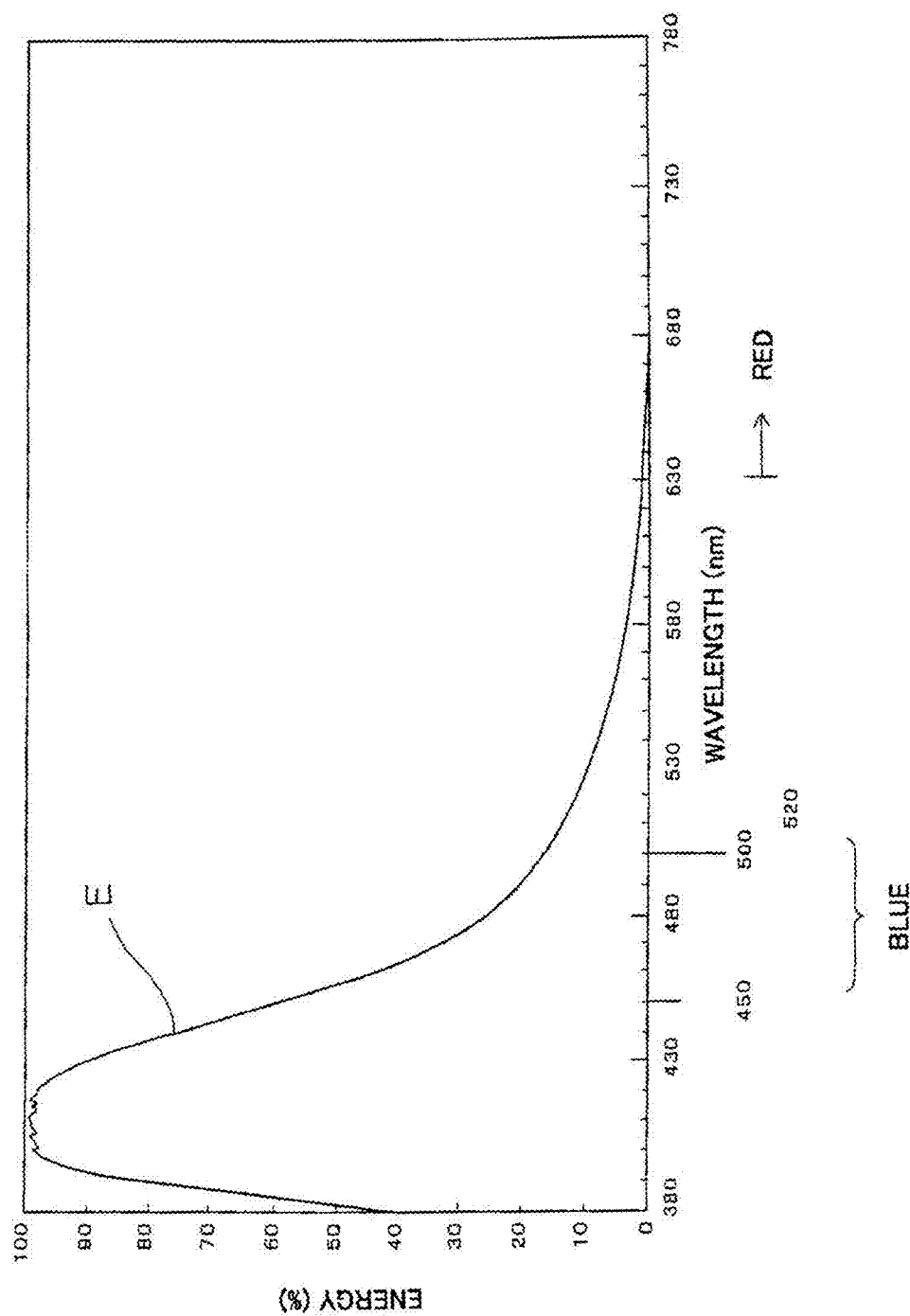
FIG. 5 is a diagram to show a wavelength range of a emitted fluorescent light when another fluorescent substance layer is used.

Next, FIG. 5 shows another example of the wavelength range of the fluorescent light emitted from the fluorescent substance layer 32. In the wavelength range shown by a curve E in FIG. 5, peak values of the fluorescent light are concentrated to the wavelength of 400 nm, and the spreading of the wavelength range is also narrower than the case shown by the curve A in FIG. 4 (A). It is, known that a wavelength of a visible light is in the range of 380 nm to 780 nm. In the fluorescent substance layer 32 which has the curve B, it is possible to cover almost the entire wavelength range of the fluorescent light by limiting the transmission wavelength range W of the wavelength filter 34 to the range approximately from 380 nm to 500 nm. By limiting the transmission wavelength range W to the range approximately from 380 nm to 500 nm, it is possible to use the visible light in the wavelength range from 500 nm to 780 nm, i.e. to use the visible light except the light of blue group.

Further, it is supposed here that a wavelength in a part of the wavelength range from 500 nm to 78.0 nm is assigned to the interference light of the interferometer 4 and that the remaining part of the wavelength range is assigned to the examination light of the foreign object detecting device 25, the measurement of height by the interferometer, the detection of foreign object by the foreign object detecting device 25, and the observation of the scanning electron image by the scanning electron microscope can be accomplished at the same time. The wavelength ranges as described above are given merely as examples, and the present invention is not limited to the wavelength ranges as described above.

Figure 6A:
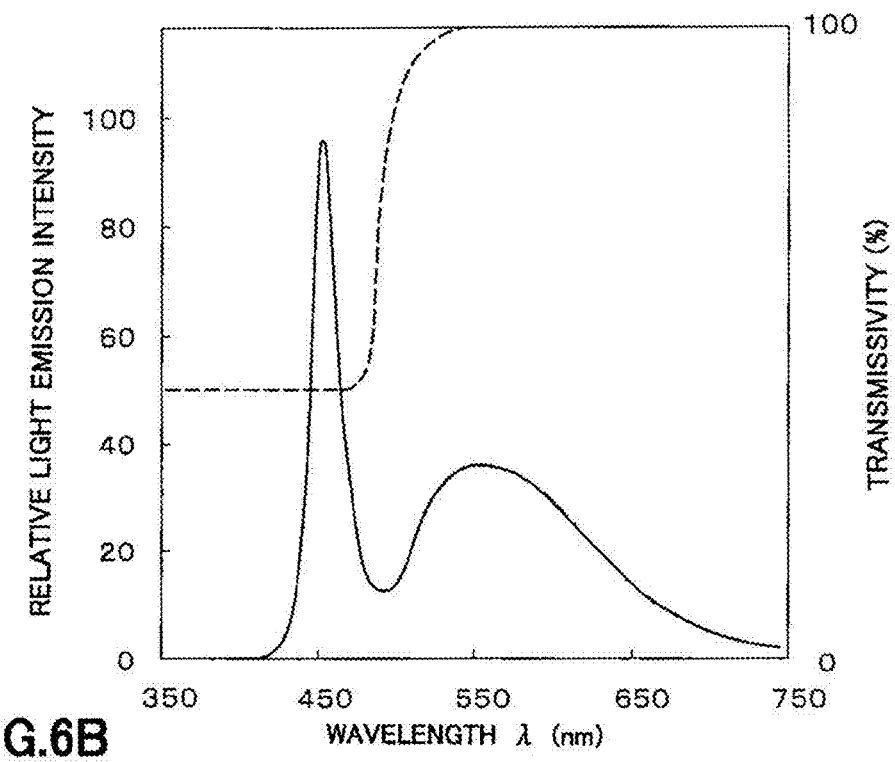
FIG. 6 (A) is a diagram to show a light emission property of an LED 13a, and FIG. 6 (B) is a diagram to show a light emission property of another LED 13h.
Figure 6B:
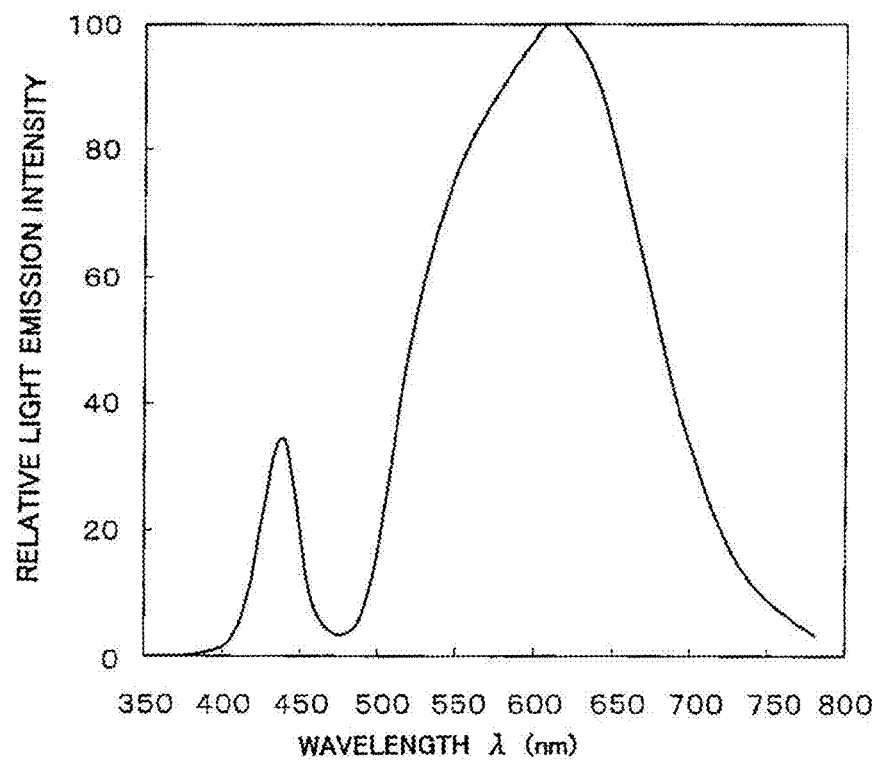
Figure 7A:
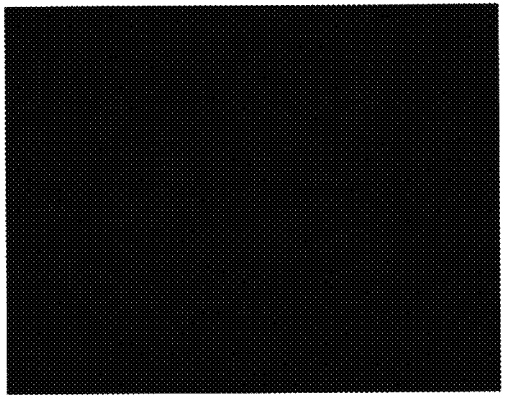
FIG. 7 (A) to FIG. 7 (F) each represents an optical photograph, each having the LED 13a as a light emitting source and showing different illumination intensity.
Figure 7B:
Figure 7C:
Figure 7D:
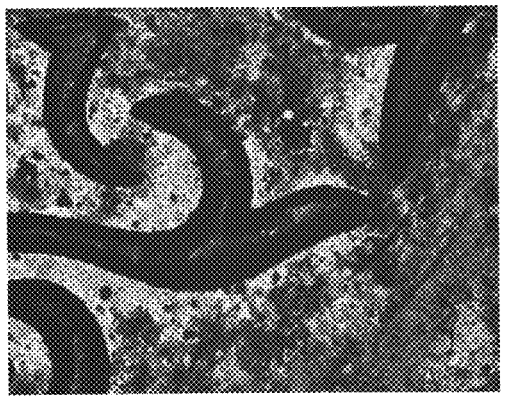
Figure 7E:
Figure 7F:
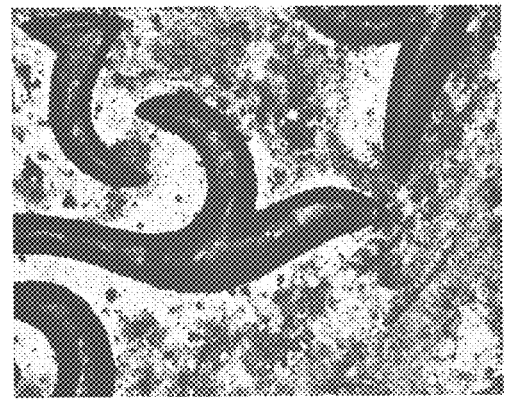
Figure 8A:
FIG. 8 (A) to FIG. 8 (F) each represents an SEM photograph in case the LED 13a is used as a light emitting source, and the illumination intensity is varied in each case.
Figure 8B:
Figure 8C:
Figure 8D:
Figure 8E:
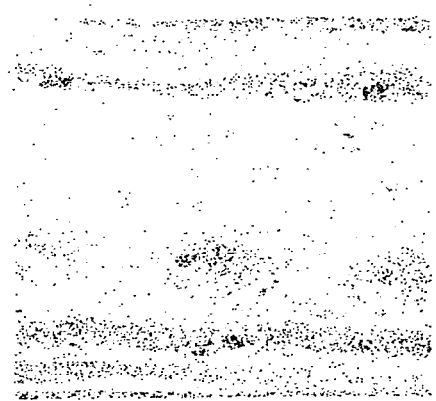
Figure 8F:
Figure 9A:
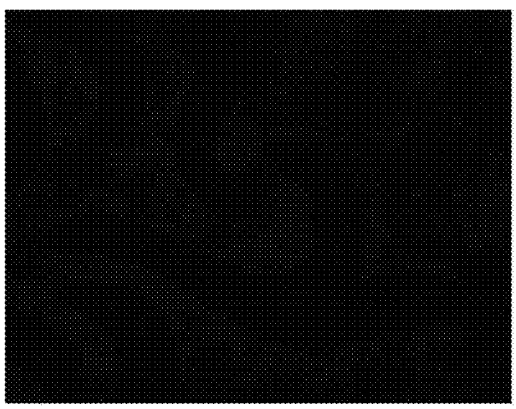
FIG. 9 (A) to FIG. 9 (F) each represents an optical photograph, each having the LED 13b as a light emitting source and showing different the illumination intensity.
Figure 9B:
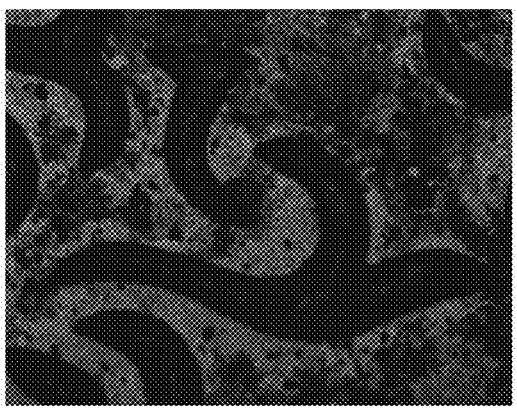
Figure 9C:
Figure 9D:
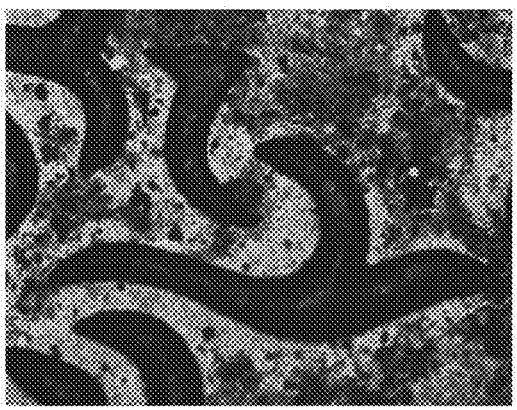
Figure 9E:
Figure 9F:
Figure 10A:
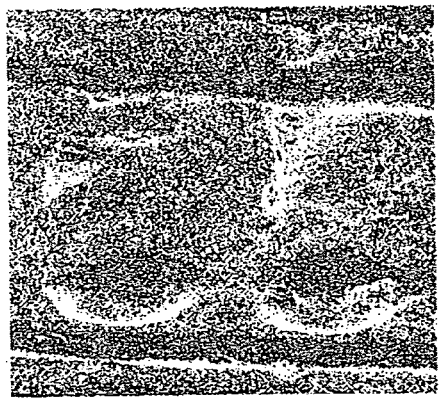
FIG. 10 (A) to FIG. 10 (F) each represents an SEM photograph in case the LED 13b is used as a light emitting source, and the illumination intensity is varied in each case.
Figure 10B:
Figure 10C:
Figure 10D:
Figure 10E:
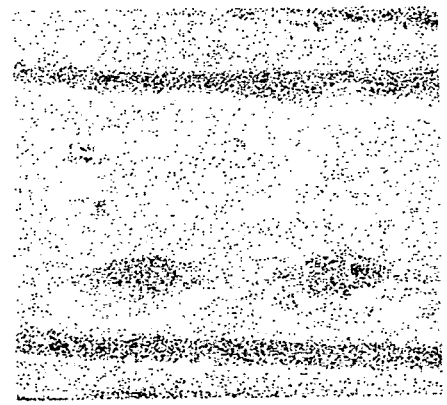
Figure 10F:
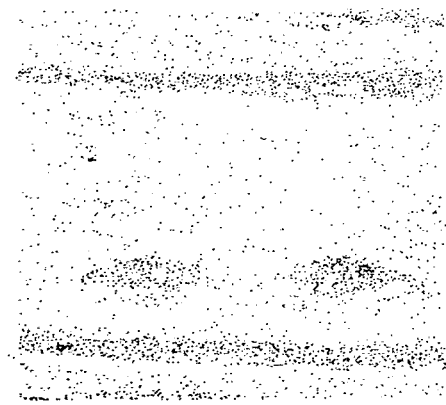

FIG. 6 (A) and FIG. 6 (B) each represents a diagram to show an example of light emission spectrum (light emission property) of an illumination light from each of the LED 13a and the LED 13b, which are different from each other. In case of an LED, which emits a white light (or a light closer to a white light), there is a peak value in blue wavelength band (near 450 nm in both of these spectra) because of the property of excitation light. It is supposed here that the LED having the spectrum shown in FIG. 6 ((A) is the LED 13a, and that the LED having the spectrum shown in FIG. 6 (B) is the LED 13b.

As described above, in a transmission wavelength range of the wavelength filter 34, W is a range from 380 nm to 500 nm, and visible light in the wavelength range from 500 nm to 780 nm is cut off. Thus, most of the wavelength ranges of the lights of each of the LED 13a and the LED 13b as given above are cut off. Specifically, the LED 13a and the LED 13b has such light emission property that the a light amount in the non-transmission wavelength range is higher than the light amount in the transmission wavelength range. Each of the LED 13a and the LED 13b has a peak value within blue wavelength range (i.e. in the wavelength range from 380 nm to 500 nm), the light in this peak wavelength range passes through a wavelength filter 34, and is detected by a wavelength detecting element 36 and is turned to noise.

Figure 2:
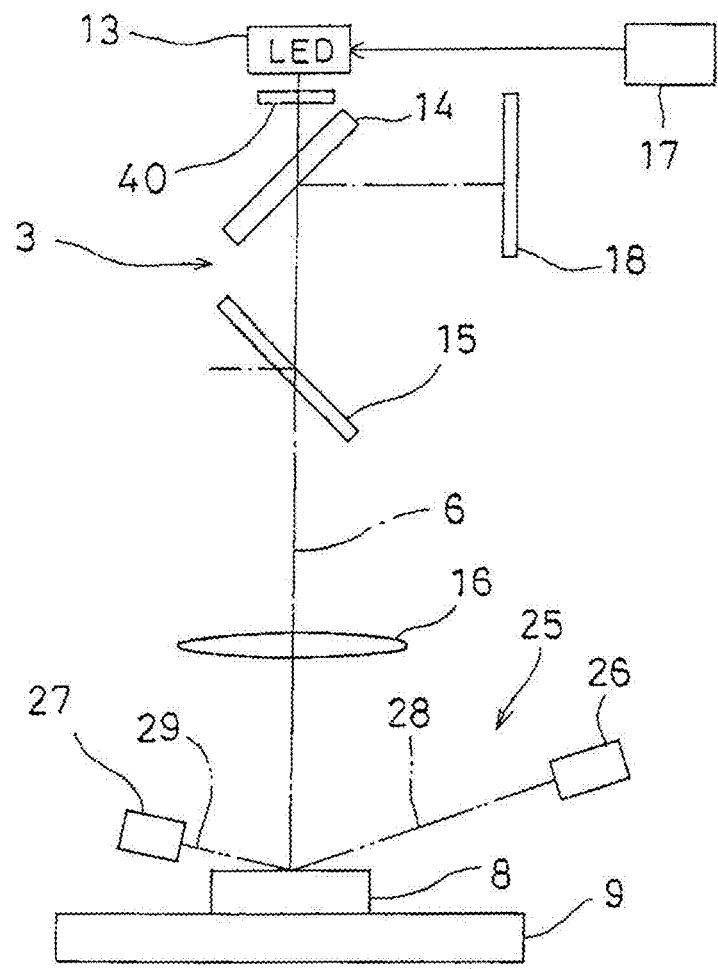
FIG. 2 is a schematical drawing to show the electron microscope device as seen from another direction.

In case of the electron microscope device 1 as shown in FIG. 1, when the wavelength filter 40 is removed and the illumination lights from the LED 13a and the LED 13b are directly illuminated, i.e. in case where a light in blue color range is included as a noise light, an optical photograph taken by the optical microscope is compared with a scanning electron image photograph (hereinafter referred as "SEM photograph") taken by the scanning electron microscope. Because the wavelength is not selected in the illumination light, the optical photograph thus obtained is almost in natural color. In case of the LED 13a, the light amount in the blue color range is higher, and bluish color prevails. In case of the LED 13b, the light amount of the red color range is higher, and reddish color prevails.

FIG. 7 (A) to FIG. 7 (F) each represents an optical photograph in case the light is illuminated from the LED 13a. FIG. 8 (A) to FIG. 8 (F) each represents an SEM photograph by the scanning electron microscope under the illuminating condition corresponding to FIG. 7 (A)-FIG. 7 (F) respectively.

When it is assumed that the illumination intensity of the LED 13a in FIG. 7 (A) is 1, the illumination intensity is 10 in FIG. 7 (B), the illumination intensity is 15 in FIG. 7 (C), the illumination intensity is 20 in FIG. 7 (D), the illumination intensity is 30 in FIG. 7 (E), and the illumination intensity is 40 in FIG. 7 (F).

When it is tried to discern from the optical photographs, the optical images are suitable for the observation with illumination intensity from 15 or higher. On the other hand, the higher the illumination intensity is, the stronger the noise will be, and the SEM images will be deteriorated. According to FIG. 8 (A) to FIG. 8 (F), the images are clearer and more distinct up to the illumination intensity 15 of the LED 13a (see FIG. 8 (C)), and the images cannot be distinguished any more when the illumination intensity is 40 (see FIG. 8 (F)). Therefore, when the illumination intensity on the LED 13a is from 15 to 20, both the optical photographs and the SEM photographs have clearness and distinctness enough for observation and examination.

When deterioration of the images beyond the limit of observation is defined as vanishing of images, and the deterioration of the images up to the limit capable of observation is defined as a limit of deterioration. The limit of deterioration differs, depending on color tone of the illumination light emitted by the LED 13, reflectivity and color of the object 8 to be measured, and it is preferable to acquire data on the limit of deterioration by carrying out the preliminary measurement.

Even when the selection of wavelength is not made with respect to the illumination light, the scanning electron images and the optical images can be simultaneously observed by adjusting the illumination intensity of the illumination light i.e. by setting S/N ratio—that is, the ratio of S: the intensity of the light emitted by a fluorescent substance hereinafter referred as "intensity of fluorescence"—in a predetermined range or a value ($\frac{1}{3}$ in the present embodiment) to N: the illumination intensity of the LED 13a.

The S/N ratio as given above may also vary according to light emission property of the LED 13 used for illumination, and also according to the reflectivity of the object 8 to be measured, etc., and the optimal S/N ratio must be set, depending on the property of the using LED 13.

For instance, the light emission property of the LED 13b is such that the light amount is higher at the wavelength of 500 nm or more with respect to the LED 13a, and a peak value in the blue color wavelength range is lower with respect to the peak value on the red color side. Therefore, if the light emission intensity is on the same level, the S/N ratio is expected to be higher in the case where the LED 13*b* is used.

FIG. 9 (A) to FIG. 9 (F) each represents an optical photograph when the light is emitted by the LED 13*b*, and FIG. 10 (A) to FIG. 10 (F) each represents an SEM photograph, which is taken by the scanning electron microscope under the illuminating conditions corresponding to each of FIG. 9 (A) to FIG. 9 (F) respectively.

When it is assumed that the illumination intensity of the LED 13*b* in FIG. 9 (A) is 1, the illumination intensity is 10 in FIG. 9 (B), the illumination intensity is 15 in FIG. 9 (C), the illumination intensity is 20 in FIG. 9 (D), the illumination intensity is 30 in FIG. 9 (E), and the illumination intensity is 40 in FIG. 9 (F).

When FIG. 7 (A) to FIG. 7 (F) are compared with FIG. 9 (A) to FIG. 9 (F) respectively, similar tendencies are observed in these two groups in case of the optical photographs. In case where the SEM photographs of FIG. 8 (A) to FIG. 8 (F) are compared with the SEM photographs of FIG. 10 (A) to FIG. 10 (F) respectively, when FIG. 8(F) with the illumination intensity 40 is compared with FIG. 10(F) the SEM photograph of FIG. 8 (F) shows extreme deterioration while the SEM photograph of FIG. 10 (F) is still distinguishable, and it is judged that the degree of deterioration of the SEM photograph is on the same level of deterioration as that of FIG. 8 (E) (i.e. the illumination intensity 30).

When observation are performed in similar manner, it is judged that the illumination intensity 30 of the LED 13*b* (see FIG. 10 (E)) shows clearness and distinctness similar to clearness and distinctness of the illumination intensity 20 of the LED 13*a* (see FIG. 8 (D)). That is, in case the LED 13*b* is used as the light source for illumination, it can be judged that both the optical photographs and the SEM photographs have clearness and distinctness capable of observation with the illumination intensity from 15 to 30.

This corresponds to the light emission property of the LED 13*b* as shown in FIG. 6 (B) that the light amount in the red color range (i.e. the light amount to be cut off by the wavelength filter 34) is higher, and the light amount in blue color range (i.e. the light amount to pass through the wavelength filter 34) is lower.

Therefore, by adjusting the illumination intensity and by selecting the light emission property of the LED 13 for illumination to be used, it is possible to obtain clearer and more distinct optical images and SEM images, and simultaneous observation of the scanning electron images and the optical images can be accomplished.

Next, description will be given on an embodiment where a wavelength filter 40 is used in the electron microscope device 1.

In FIG. 6 (A), the wavelength transmission property of the wavelength filter 40 is shown by a broken line. Here, it is assumed that, when the wavelength transmission property of the wavelength filter 40 is in the range from 380 nm to 500 nm, the transmissivity is 50%, and when the wavelength transmission property is 500 nm or more, the transmissivity is 90% or more, (hereinafter, the transmission of 90% or more is simply referred as "transmission"). Here, it is needless to say that the wavelength transmission property of the wavelength filter 40 can be adequately changed, depending on the wavelength range to be emitted from the electron-optical conversion member 33, or on the wavelength transmission property of the wavelength filter 34.

By the use of the wavelength filter 40, the light amount in the blue color range of the illumination light is decreased, and clearness and distinctness of the optical photographs and the SEM photographs are improved. Because the light amount of the blue color range is included, the color of the optical images obtained can be made closer to natural color.

Further, it is also possible to set the transmissivity to 20% or 10%. In this case, a color tone adjusting portion (not shown) may be provided on the control unit 5. By increasing amplification ratio of the blue color range and adjusting the color tone of the optical images, distinctness of the SEM photograph can be increased and the color of the optical images obtained can be made closer to natural color.

The transmissivity of the wavelength filter 40 is set up by taking the light emission property of the LED 13 into account. For instance, the transmissivity of the blue color range is set to 10% for the LED 13*a* and the transmissivity is set to 20% for the LED 13*b*.

Thus, by setting up so that a predetermined % of the light of the blue color range passes through the wavelength selective filter which is provided with illumination optical system of the optical microscope 3, the scanning electron images and the optical images can be observed at the same time, and the optical images can be observed in natural color or in a condition closer to natural color.

In the embodiment as described above, the wavelength transmission property of the wavelength filter 40 is set to match the light emission property of the light source, while it may be so designed that the wavelength transmission property of the wavelength filter 40 is set to match the wavelength transmission property of the wavelength filter 34.

Figure 11:
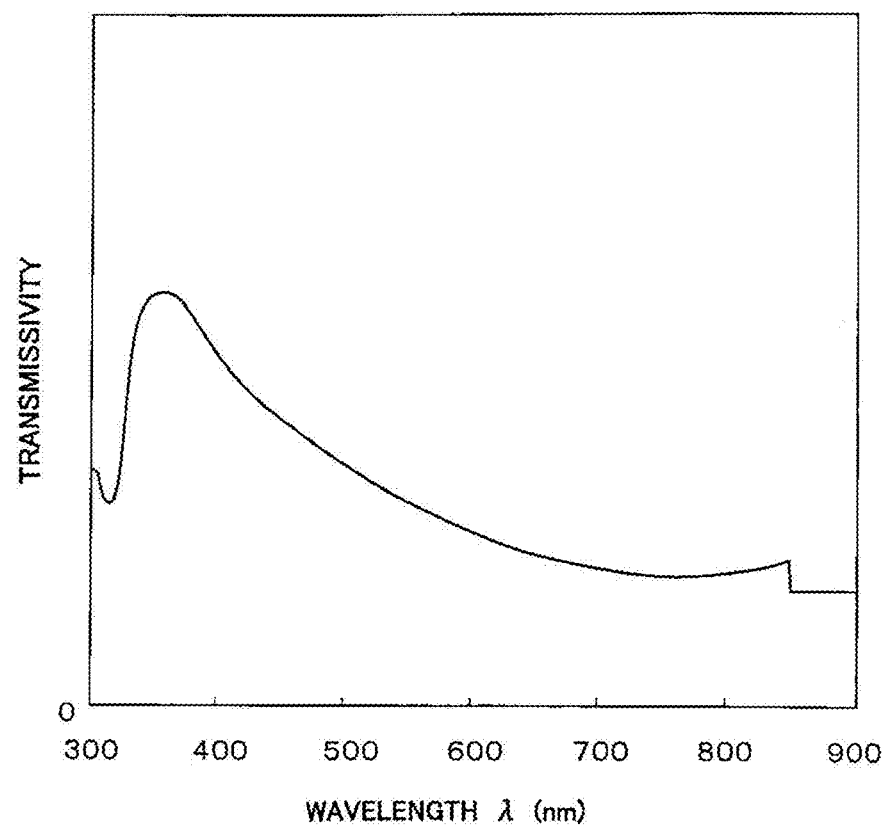
FIG. 11 is a diagram to show transmissivity of a wavelength filter disposed on a wavelength detector.

For instance, if the wavelength filter 34 has wavelength transmission property as shown in FIG. 11 and if the light amount of the blue color component of the illumination light is reduced to about ⅓, the influential component (direct current component) would be about the same as influential component of other colors. That is, by setting the transmissivity of the blue color of the wavelength filter 40 (on the LED 13*a* side) to about 33%, the illumination intensity S of the blue color range of the LED 13 can be equalized to the transmissivity near the green color and the red color with respect to the blue color of the wavelength filter 34 of the electron detector 12 (R:G:B=3:1:1 approximately in this case). As a result, detection intensity of wavelength range of blue color with respect to the wavelength range of green color and to the wavelength range of red color can be adjusted to the same level to a certain extent.

As described above, the wavelength range to be detected by the electron detector 12, and the wavelength range of the examination light are separated from each other. Further, the scanning electron image and the optical image can be observed simultaneously. As a result, convenience and usability of the electron microscope device 1 can be improved further.

Specifically, the optical image of the object 8 to be measured is observed first by the optical microscope 3, and a position to be observed is specified. While observing the optical image, an examination light is projected by the foreign object detecting device 25. By detecting the scattered light, a position to be projected is further defined. Next, the electron beam is projected, and the scanning electron image at the position to be observed is inspected.

A field angle of the optical system of the optical microscope 3, a field angle of the examination light, and a field angle of the electron beam are sequentially decreased. As a result, a position to be projected by the electron beam can be easily specified. Also, the observation by the optical microscope 3 and the observation by the foreign object detecting device 25 can be carried out simultaneously. As a result, the observation point can be adjusted or changed at any particular time in easy and simple manner.

The wavelength filter 34 of the electron detector 12 may be removably mounted. Thereby, in case that it is not necessary to observe simultaneously, the electron microscope device 1 is used in condition that the illumination light turned off and the observation at higher sensitivity can be carried out. This is particularly effective when it is wanted to increase the S/N ratio.

When a foreign object is detected by the foreign object detecting device 25, the foreign object may be inspected, for instance, physical property of the foreign object may be identified by using the means such as spectrum analysis based on the information which is obtained by the electron detector 12.

The invention claimed is:

1. An electron microscope device, comprising a scanning electron microscope and an optical microscope, wherein said scanning electron microscope has a scanner and an electron detector for detecting electrons issued from a specimen scanned over by an electron beam, and said scanning electron microscope acquires a scanning electron image based on a detection result from said electron detector, and said optical microscope has a light emitting source for illuminating an illumination light, and said optical microscope illuminates said illumination light to said specimen, and acquires an optical image by receiving a reflection light from said specimen, and wherein said electron detector has a fluorescent substance layer for electron-light conversion, a wavelength filter having a transmission wavelength range and a non-transmission wavelength range for restricting so that all or almost all of wavelength ranges of the fluorescent light from said fluorescent substance layer passes through, and a wavelength detecting element for receiving said fluorescent light passing through said wavelength filter and performing optical-electric conversion, wherein said illumination light includes a wavelength range that passes through said wavelength filter and wherein the light amount of said wavelength range does not exceed a limit of deterioration of said scanning electron image, thereby allowing simultaneous use of said illumination light and said electron beam, wherein said light emitting source is an LED, and said LED has a light emission property wherein light intensity of a frequency spectrum included in the transmission wavelength range of said wavelength filter is lower than light intensity of a frequency spectrum included in said non-transmission wavelength range.

2. The electron microscope device according to claim 1, further comprising an interferometer for projecting an interference light to a surface of said specimen and for detecting a position in height direction of said specimen by using reflection of said interference light from the surface of said specimen, wherein said interference light has a wavelength different from the transmission wavelength range of said wavelength filter.

3. The electron microscope device according to claim 1, further comprising a foreign object detecting device comprising an examination light which is projected toward a surface of said specimen, and an interferometer for projecting an interference light to the surface of said specimen and for detecting a position in height direction of said specimen by using reflection of said interference light from the surface of said specimen, wherein said examination light and said interference light have wavelengths different from the transmission wavelength range of said wavelength filter, and said examination light and said interference light have wavelength ranges different from each other.

4. An electron microscope device, comprising a scanning electron microscope and an optical microscope, wherein said scanning electron microscope has a scanner and an electron detector for detecting electrons issued from a specimen scanned over by an electron beam, and said scanning electron microscope acquires a scanning electron image based on a detection result from said electron detector, and said optical microscope has a light emitting source for illuminating an illumination light, and said optical microscope illuminates said illumination light to said specimen, and acquires an optical image by receiving a reflection light from said specimen, and wherein said electron detector has a fluorescent substance layer for electron-light conversion, a wavelength filter having a transmission wavelength range and a non-transmission wavelength range for restricting so that all or almost all of wavelength ranges of the fluorescent light from said fluorescent substance layer passes through, and a wavelength detecting element for receiving said fluorescent light passing through said wavelength filter and performing optical-electric conversion, wherein said illumination light includes a wavelength range that passes through said wavelength filter and wherein the light amount of said wavelength range does not exceed a limit of deterioration of said scanning electron image, thereby allowing simultaneous use of said illumination light and said electron beam, wherein an illumination light optical system of said optical microscope has a wavelength selective filter for illumination, said light emitting source illuminates said illumination light including a wavelength of a visible light range, and said wavelength selective filter for illumination restricts transmissivity of a wavelength corresponding to the transmission wavelength range of said wavelength filter and allows a wavelength corresponding to the non-transmission wavelength range of said wavelength filter to pass.

5. An electron microscope device, comprising a scanning electron microscope and an optical microscope, wherein said scanning electron microscope has a scanner and an electron detector for detecting electrons issued from a specimen scanned over by an electron beam, and said scanning electron microscope acquires a scanning electron image based on a detection result from said electron detector, and said optical microscope has a light emitting source for illuminating an illumination light, and said optical microscope illuminates said illumination light to said specimen, and acquires an optical image by receiving a reflection light from said specimen, and wherein said electron detector has a fluorescent substance layer for electron-light conversion, a wavelength filter having a transmission wavelength range and a non-transmission wavelength range for restricting so that all or almost all of wavelength ranges of the fluorescent light from said fluorescent substance layer passes through, and a wavelength detecting element for receiving said fluorescent light passing through said wavelength filter and performing optical-electric conversion, wherein said illumination light includes a wavelength range that passes through said wavelength filter and wherein the light amount of said wavelength range does not exceed a limit of deterioration of said scanning electron image, thereby allowing simultaneous use of said illumination light and said electron beam, wherein an illumination light optical system of said optical microscope has a wavelength selective filter for illumination, said light emitting source is an LED, and said wavelength selective filter for illumination restricts transmissivity of a wavelength corresponding to the transmission wavelength range of said wavelength filter and allows a wavelength corresponding to the non-transmission wavelength range of said wavelength filter to pass.

6. The electron microscope device according to claim 5, wherein said light emitting source is an LED, and said LED has a light emission property wherein light amount of the transmission wavelength range of said wavelength filter is higher than light amount of the non-transmission wavelength range.

7. The electron microscope device according to claim 5, comprising a control unit, wherein said control unit amplifies and adjusts a color tone with respect to a wavelength band passing through said wavelength selective filter for illumination among wavelength ranges of optical images acquired by said optical microscope.

8. The electron microscope device according to claim 1, further comprising a foreign object detecting device, comprising an examination light which is projected toward a surface of said specimen, wherein said examination light is designed to have a wavelength different from the transmission wavelength range of said wavelength filter.

* * * * *